United States Patent
Asano

(10) Patent No.: US 9,701,902 B2
(45) Date of Patent: Jul. 11, 2017

(54) ETCHING METHOD, METHOD OF MANUFACTURING ARTICLE, AND ETCHING SOLUTION

(71) Applicant: Kabushiki Kaisha Toshiba, Minato-ku (JP)

(72) Inventor: Yusaku Asano, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/845,818

(22) Filed: Sep. 4, 2015

(65) Prior Publication Data

US 2016/0079078 A1 Mar. 17, 2016

(30) Foreign Application Priority Data

Sep. 11, 2014 (JP) ................. 2014-185570

(51) Int. Cl.
- *H01L 21/311* (2006.01)
- *C09K 13/08* (2006.01)
- *H01L 21/78* (2006.01)
- *H01L 21/306* (2006.01)

(52) U.S. Cl.
CPC ........ *C09K 13/08* (2013.01); *H01L 21/30604* (2013.01); *H01L 21/78* (2013.01)

(58) Field of Classification Search
USPC ........................................ 438/694
See application file for complete search history.

(56) References Cited

U.S. PATENT DOCUMENTS

| | | | |
|---|---|---|---|
| 6,762,134 B2 | 7/2004 | Bohn et al. | |
| 6,790,785 B1 | 9/2004 | Li et al. | |
| 8,278,191 B2 | 10/2012 | Hildreth et al. | |
| 8,486,843 B2 | 7/2013 | Li et al. | |
| 2015/0123249 A1* | 5/2015 | Hildreth | H01Q 17/00 257/618 |
| 2015/0130028 A1 | 5/2015 | Asano et al. | |

FOREIGN PATENT DOCUMENTS

| | | |
|---|---|---|
| EP | 1 581 668 B1 | 11/2010 |
| JP | 11-238720 A | 8/1999 |
| JP | 2005-109318 A | 4/2005 |
| JP | 2009-044129 A | 2/2009 |
| JP | 2011-060846 A | 3/2011 |
| JP | 2011-101009 | 5/2011 |
| JP | 2012-114449 A | 6/2012 |
| JP | 2012-256876 A | 12/2012 |

(Continued)

OTHER PUBLICATIONS

Combined Taiwanese Office Action and Search Report issued Jul. 7, 2016 in Patent Application No. 104129063 (with translation).

(Continued)

*Primary Examiner* — Roberts Culbert
(74) *Attorney, Agent, or Firm* — Oblon, McClelland, Maier & Neustadt, L.L.P.

(57) ABSTRACT

An etching method according to an embodiment includes forming a catalyst layer made of a noble metal on a structure made of a semiconductor, and dipping the structure in an etching solution containing hydrofluoric acid, an oxidizer, and an organic additive to remove a portion of the structure that is in contact with the catalyst layer.

8 Claims, 20 Drawing Sheets

(56) References Cited

FOREIGN PATENT DOCUMENTS

| JP | 2013-527103 | 6/2013 |
|---|---|---|
| KR | 10-2008-0015027 A | 2/2008 |
| KR | 10-2014-0083006 A | 7/2014 |
| TW | 201225173 A1 | 6/2012 |
| WO | WO 2014/069517 A1 | 5/2014 |

OTHER PUBLICATIONS

Taiwanese Office Action issued Oct. 18, 2016 in Patent Application No. 104129063 with English translation.
Japanese Office Action issued Oct. 4, 2016 in Patent Application No. 2014-185570 with English translation.
Yoshiko Harada et al. "Catalytic Amplification of the Soft Lithographic Patterning of Si. Nonelectrochemical Orthogonal Fabrication of Photoluminescent Porous Si Pixel Arrays" Journal of the American Chemical Society, American Chemical Society, Aug. 16, 2001, vol. 123, pp. 8709-8717.
Office Action issued Aug. 30, 2016 in Korean Patent Application No. 10-2015-0123688 (with English language translation).

\* cited by examiner

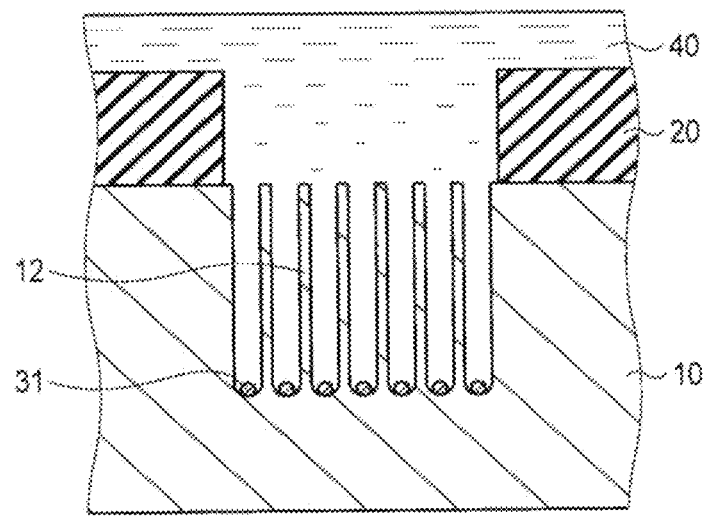
F I G. 5
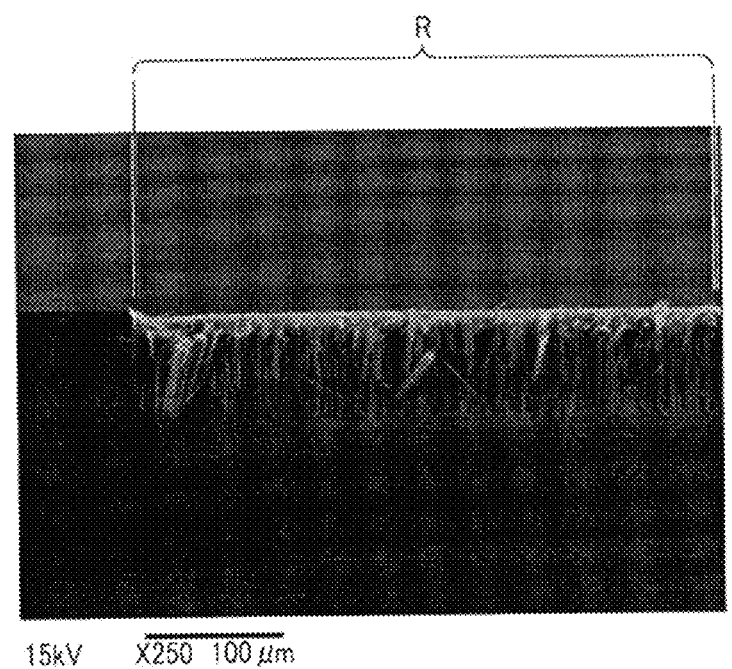
F I G. 6

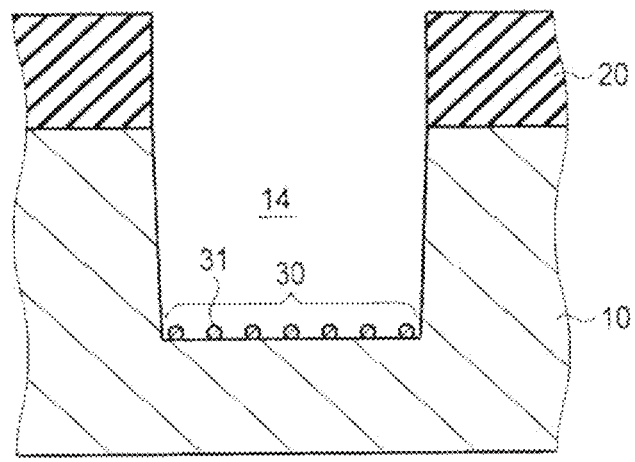
F I G. 8
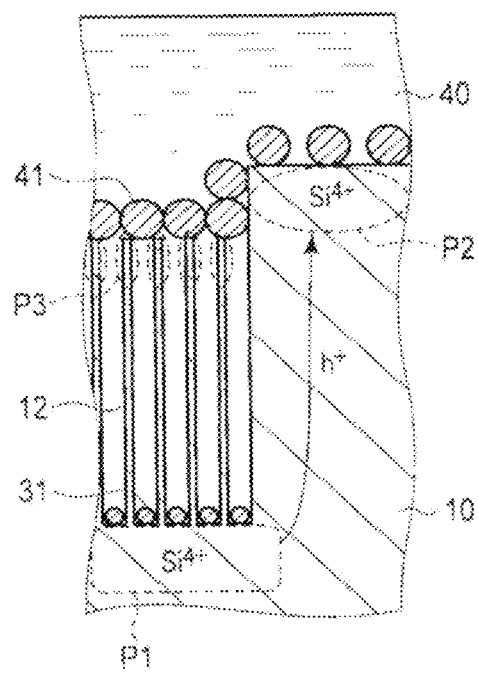
F I G. 9

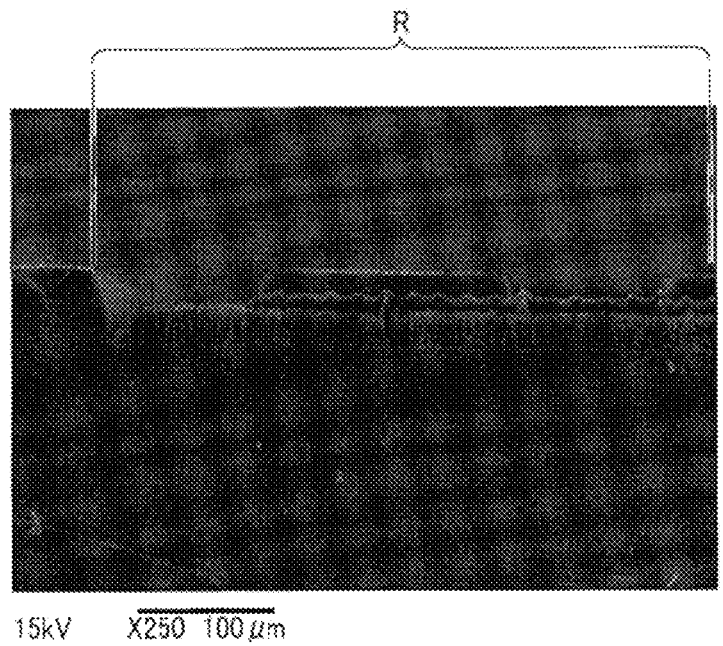
F I G. 13
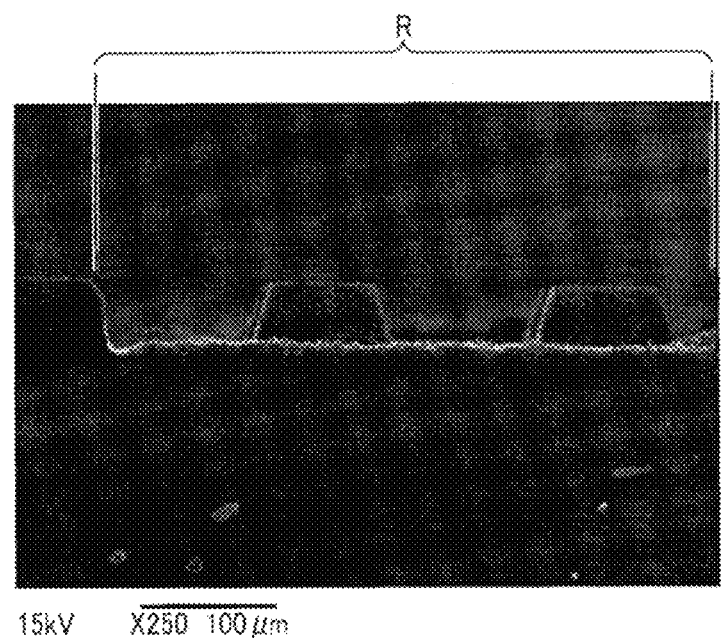
F I G. 14

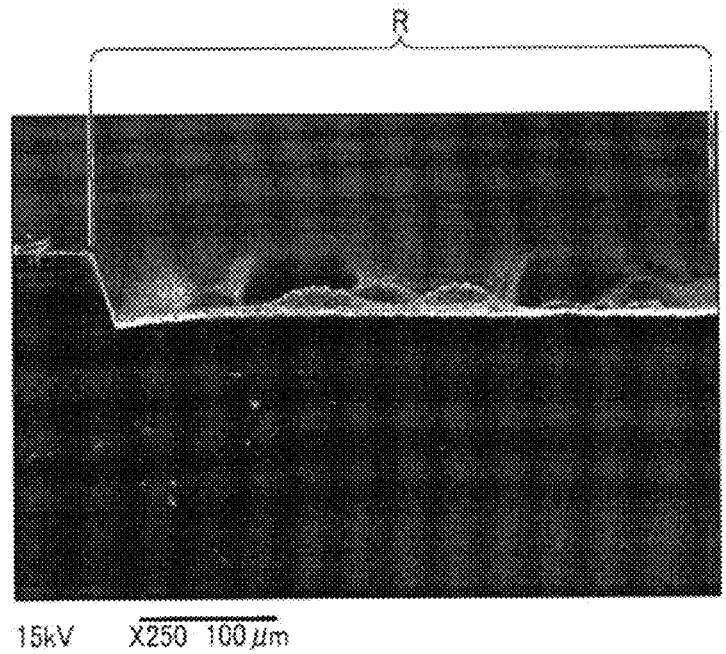
F I G. 17
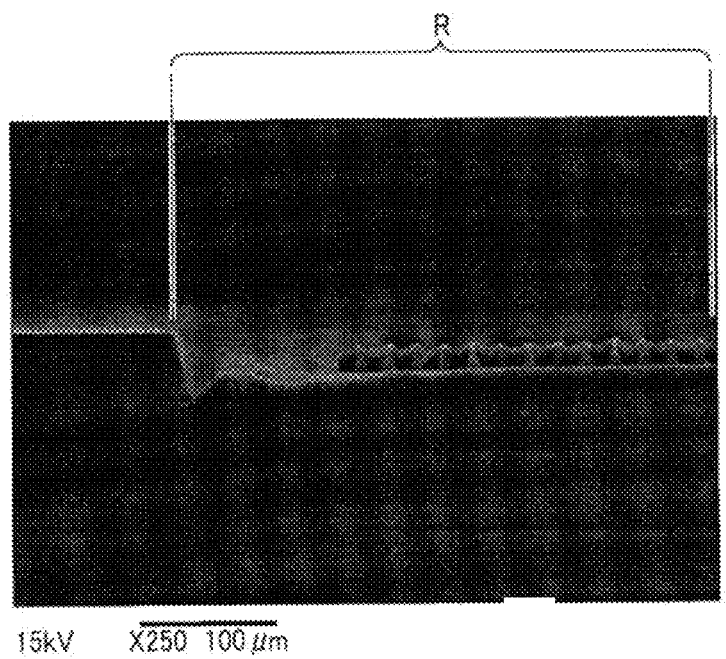
F I G. 18

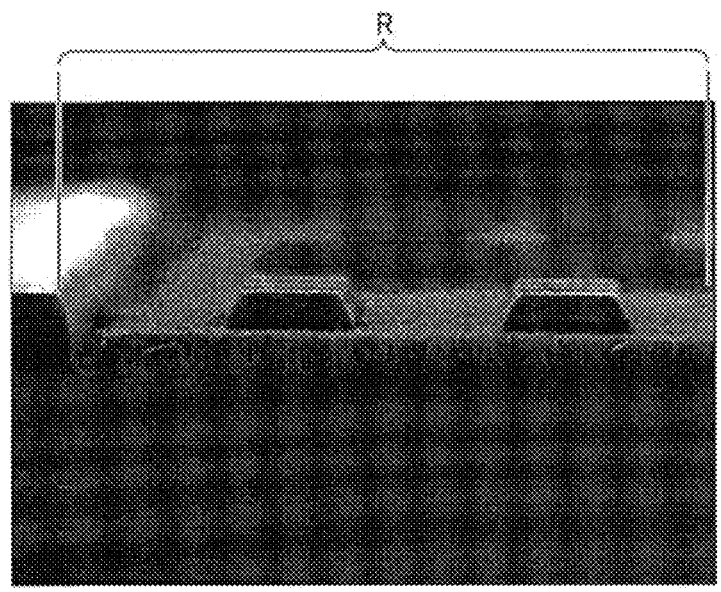
F I G. 19
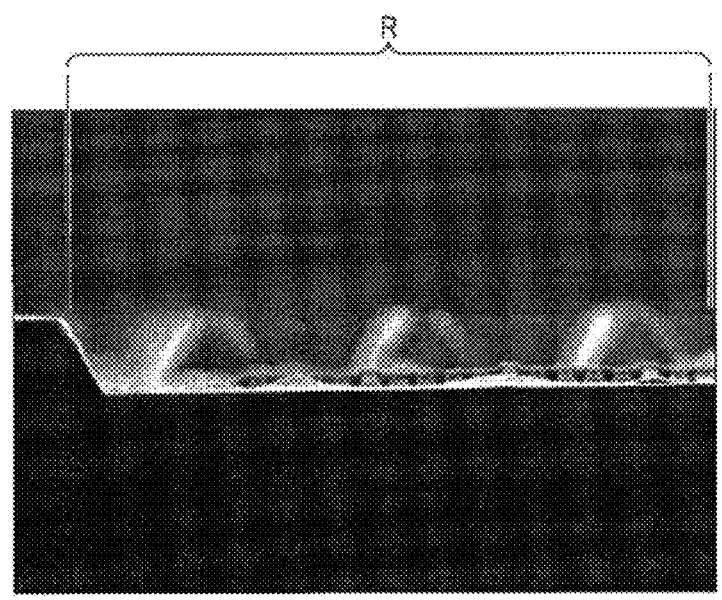
F I G. 20

F I G. 25
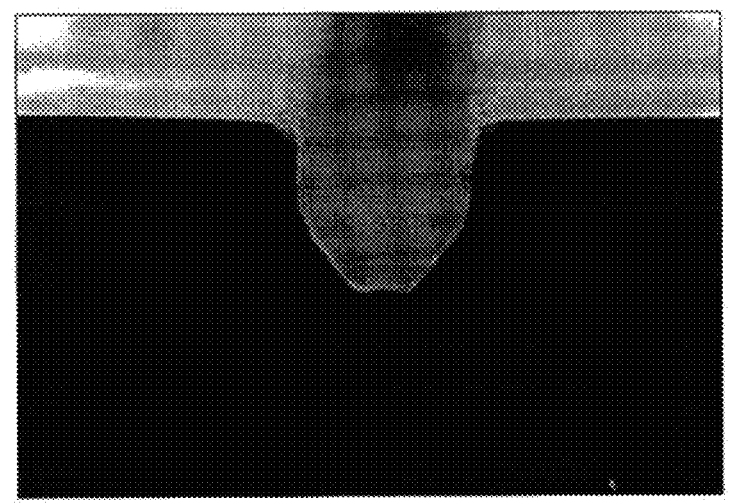
F I G. 26

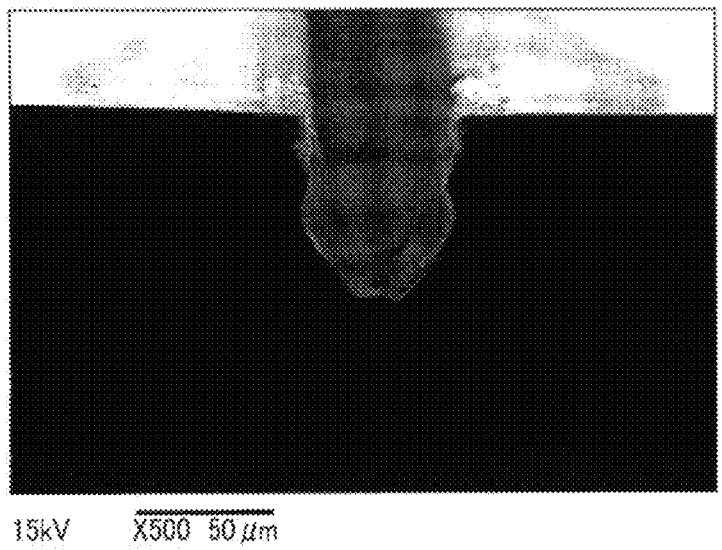
F I G. 27
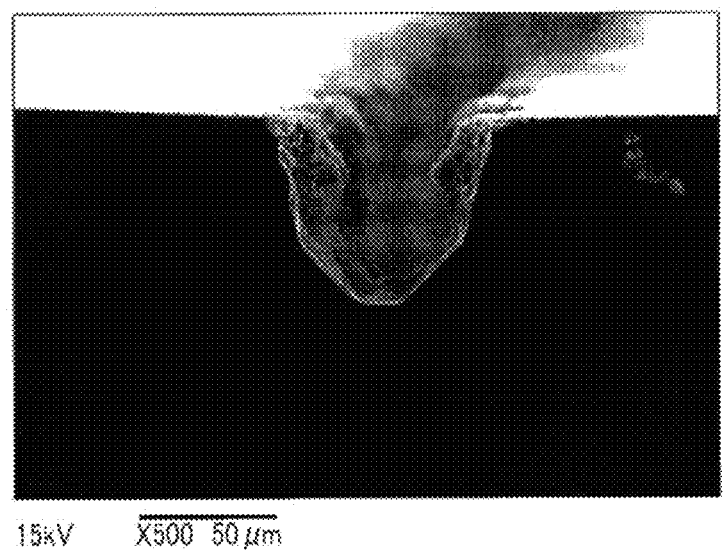
F I G. 28

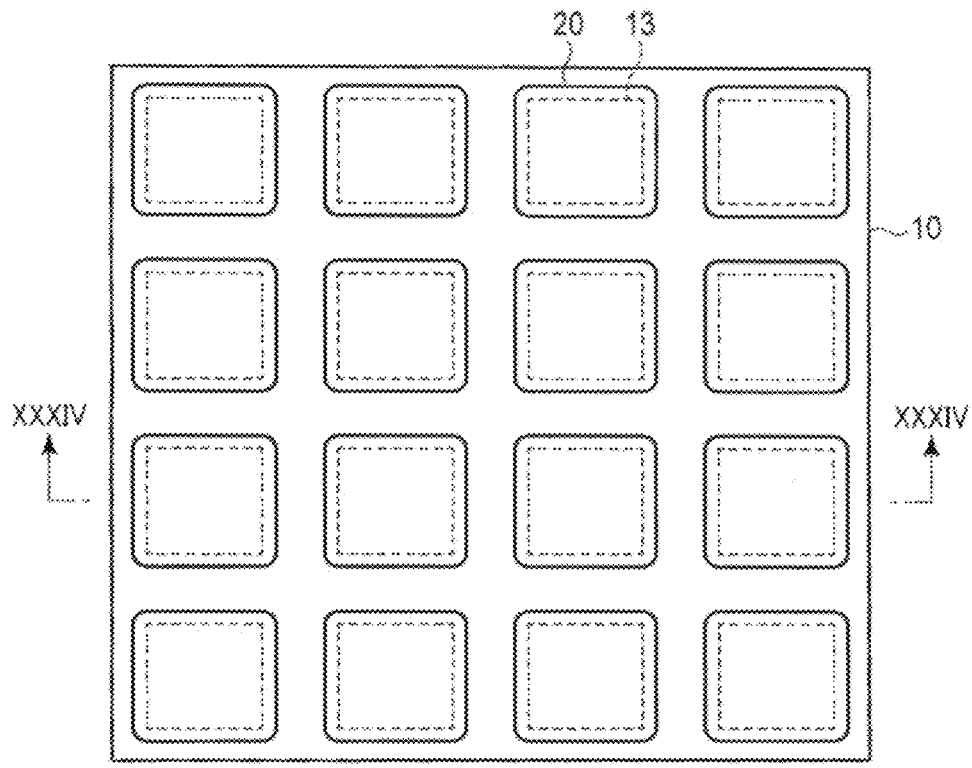
F I G. 33
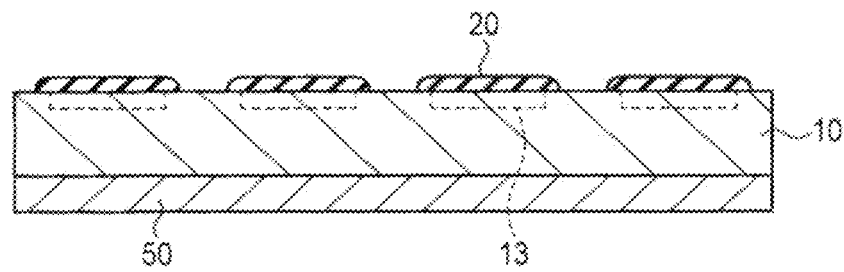
F I G. 34

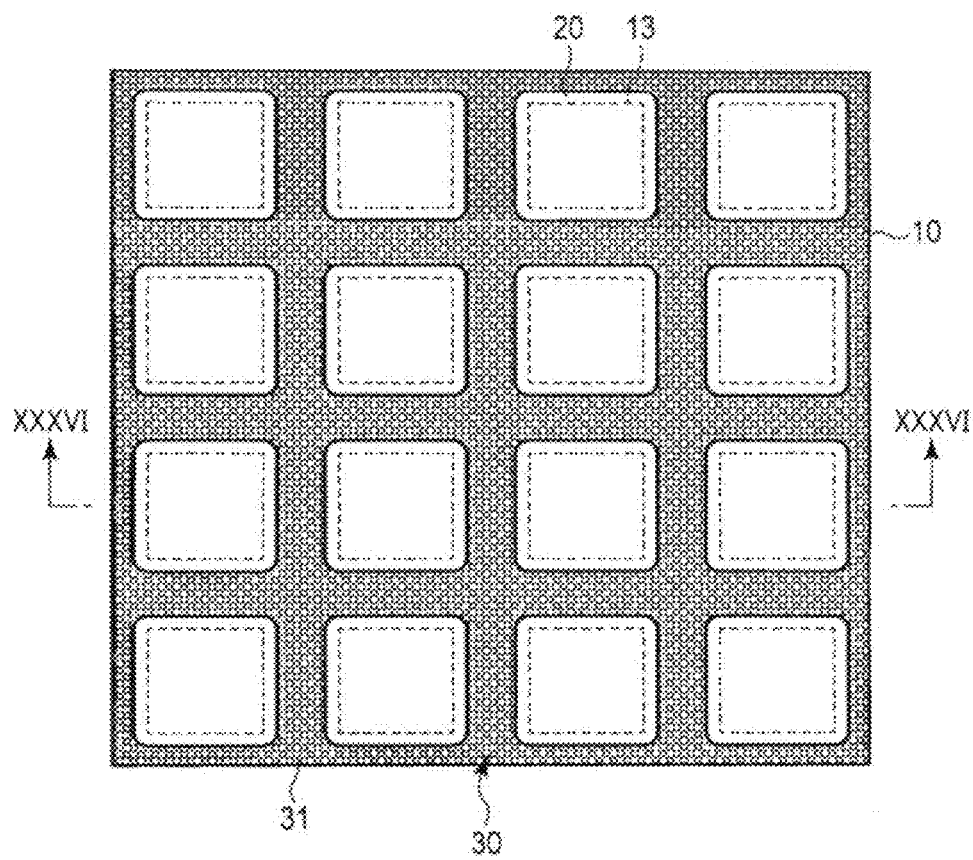
F I G. 35
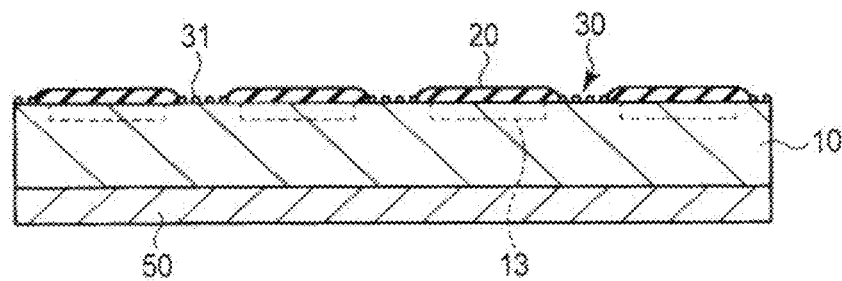
F I G. 36

ETCHING METHOD, METHOD OF MANUFACTURING ARTICLE, AND ETCHING SOLUTION

CROSS-REFERENCE TO RELATED APPLICATIONS

This application is based upon and claims the benefit of priority from Japanese Patent Applications No. 2014-185570, filed Sep. 11, 2014, the entire contents of which are incorporated herein by reference.

FIELD

Embodiments described herein relate generally to an etching technique.

BACKGROUND

In microstructure manufacturing processes such as processes of manufacturing microelectromechanical system (MEMS) and through-silicon via (TSV), the necessity of a deep etching technique is increasing for forming a trench or via hole with a depth of a few μm to a few ten μm in a substrate made of a semiconductor such as Si.

As semiconductor etching, generally used are isotropic wet etching using an etching solution containing hydrofluoric acid, nitric acid, and acetic acid, anisotropic etching using an alkali solution such as tetramethylammonium hydroxide (TMAH) or KOH, and dry etching using a plasma of an etching gas such as $SF_6$ or $CF_4$.

In isotropic wet etching, however, etching in the widthwise direction, i.e., side etching occurs in addition to etching in the depth direction. This makes it impossible to achieve a high aspect ratio (the ratio of the depth to the width of a recess).

In anisotropic etching, high-aspect-ratio deep etching can be performed by using an etching rate difference corresponding to the crystal orientation of a semiconductor. In this case, however, the shape of a pattern to be formed by etching and the crystal orientation of a semiconductor must be so determined that the etching rate in the depth direction is much higher than that in the widthwise direction. That is, the shape of a structure to be formed by etching is limited, so design limitations are large.

The deep etching techniques using dry etching include a technique called a Bosch process. In this Bosch process, plasma etching using $SF_6$ gas or the like and sidewall protective film formation using $C_4F_8$ gas or the like are alternately repeated. This technique has a problem that a fluorocarbon-based deposit remains on sidewalls and exerts influence on the performance of the device. This technique also has a problem that sidewalls are formed into a scalloped shape.

Recently, a method called a metal-assisted chemical etching (MacEtch) method has been developed. In this MacEtch method, a catalyst pattern made of a noble metal is formed on the surface of a semiconductor substrate, and the semiconductor substrate is dipped in a solution mixture of hydrofluoric acid and an oxidizer. That portion of the semiconductor substrate, which is in contact with the catalyst, is preferentially etched, and the catalyst moves downward as the etching progresses. Consequently, a trench or via hole whose depth direction is perpendicular to the surface of the substrate is obtained. However, this perpendicularity is not obtained depending on the conditions.

BRIEF DESCRIPTION OF THE DRAWINGS

FIG. 5 is a sectional view schematically showing an example of a structure obtained by an etching method using no organic additive;

FIG. 6 is an electron micrograph of a section of the structure obtained by the etching method using no organic additive;

FIG. 8 is a sectional view schematically showing an example of a structure obtained by the etching method according to the embodiment;

FIG. 9 is a schematic sectional view for explaining the reason why needle-like residual portions hardly form;

FIG. 13 is an electron micrograph of a section of a structure obtained when the concentration of polyethylene glycol (average molecular weight=200) in an etching solution was 0.01 mass %;

FIG. 14 is an electron micrograph of a section of a structure obtained when the concentration of polyethylene glycol (average molecular weight=200) in an etching solution was 0.1 mass %;

FIG. 17 is an electron micrograph of a section of a structure obtained when the concentration of polyethylene glycol (average molecular weight=400) in an etching solution was 0.1 mass %;

FIG. 18 is an electron micrograph of a section of a structure obtained when the concentration of polyethylene glycol (average molecular weight=400) in an etching solution was 1 mass %;

FIG. 19 is an electron micrograph of a section of a structure obtained when the concentration of polyethylene glycol (average molecular weight=1,000) in an etching solution was 0.01 mass %;

FIG. 20 is an electron micrograph of a section of a structure obtained when the concentration of polyethylene glycol (average molecular weight=1,000) in an etching solution was 0.1 mass %;

FIG. 25 is an electron micrograph of a section of a structure obtained when using polyethylene glycol (average molecular weight=1,000) as an organic additive;

FIG. 26 is an electron micrograph of a section of a structure obtained when using polyethylene glycol (average molecular weight=4,000) as an organic additive;

FIG. 27 is an electron micrograph of a section of a structure obtained when using polyethylene glycol (average molecular weight=6,000) as an organic additive;

FIG. 28 is an electron micrograph of a section of a structure obtained when using polyethylene glycol (average molecular weight=20,000) as an organic additive;

FIG. 33 is a plan view schematically showing an insulating layer formation step in a semiconductor device manufacturing method according to an embodiment;

FIG. 34 is a sectional view taken along a line XXXIV-XXXIV of the structure shown in FIG. 33;

FIG. 35 is a plan view schematically showing a catalyst layer formation step in the semiconductor device manufacturing method according to the embodiment;

FIG. 36 is a sectional view taken along a line XXXVI-XXXVI of the structure shown in FIG. 35;

DETAILED DESCRIPTION

Figure 1:
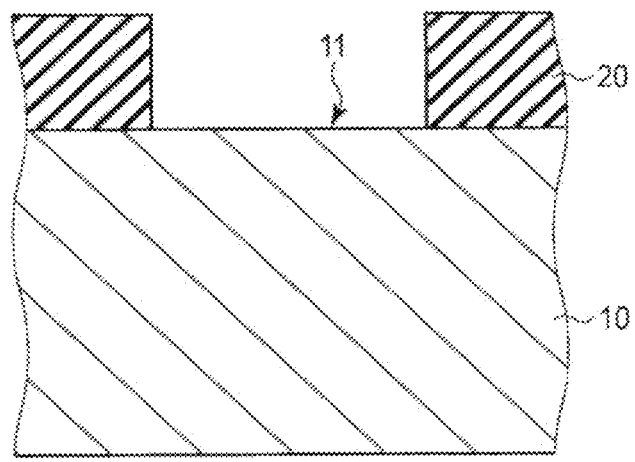
FIG. 1 is a sectional view schematically showing an insulating layer formation step in an etching method according to an embodiment.

Embodiments will be explained in detail below with reference to the accompanying drawings. Note that the same reference numerals denote constituent elements which achieve the same or similar functions throughout all the drawings, and a repetitive explanation will be omitted.

In an etching method according to an embodiment, a structure 10 shown in FIG. 1 is first prepared.

The structure 10 is made of a semiconductor. This semiconductor is selected from semiconductors made of Si, Ge, compounds of group-III and group-V elements such as GaAs and GaN, and SiC. Note that a term "group" herein used is "a group" in the short-form periodic table.

The structure 10 is, e.g., a semiconductor wafer. An impurity can be doped in this semiconductor wafer, or a semiconductor element such as a transistor or diode can be formed on the semiconductor wafer. Also, the principal surface of the semiconductor wafer can be parallel to any crystal plane of the semiconductor.

Then, an insulating layer 20 is formed on the structure 10.

The insulating layer 20 has an opening. In this method, a region 11 of the structure 10, which corresponds to the opening of the insulating layer, is removed by etching.

Any material can be used as the material of the insulating layer 20, provided that the material can suppress deposition of a noble metal (to be described later) on a region of the surface of the structure 10, which is covered with the insulating layer 20. Examples of the material are organic materials such as polyimide, a fluorine resin, a phenolic resin, an acrylic resin, and a novolak resin, and inorganic materials such as silicon oxide and silicon nitride.

The insulating layer 20 can be formed by, e.g., existing semiconductor processes. The insulating layer 20 made of an organic material can be formed by, e.g., photolithography. The insulating layer 20 made of an inorganic material can be formed by, e.g., deposition of an insulating layer by vapor phase deposition, formation of a mask by photolithography, and patterning of the insulating layer by etching. Alternatively, the insulating layer 20 made of an inorganic material can be formed by oxidation or nitriding of the surface region of the structure 10, formation of a mask by photolithography, and patterning of an insulating layer by etching.

Figure 2:
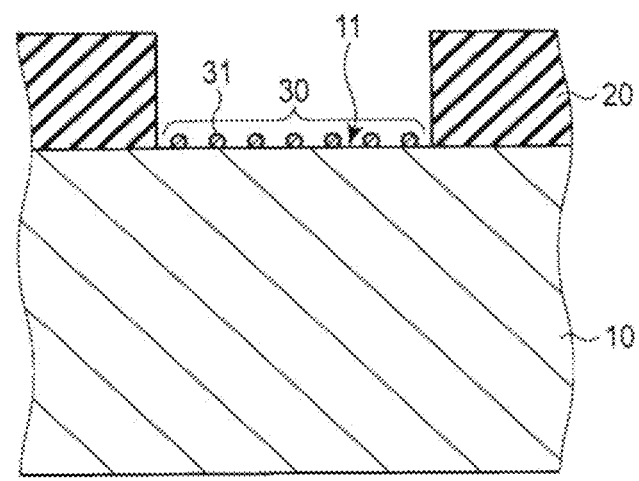
FIG. 2 is a sectional view schematically showing a catalyst layer formation step in the etching method according to the embodiment.

Subsequently, a catalyst layer 30 is formed on the region 11 as shown in FIG. 2.

The catalyst layer 30 is an aggregate of a plurality of particles 31 each made of a noble metal. The catalyst layer 30 is used to activate the oxidation reaction of the semiconductor that constitutes the region 11 in contact with the catalyst layer 30. The noble metal can be selected from, e.g., Au, Ag, Pt, Pd, and combinations thereof.

The shape of the noble metal particle 31 is preferably spherical. The noble metal particle 31 may also have another shape such as a rod-like shape or plate-like shape. The particle size of the noble metal particle 31 is not particularly limited as long as the particle size is much smaller than the width of the region 11. For example, the particle size of the noble metal particle 31 is several tens of nm to several hundreds of nm, and typically, 50 to 200 nm. Also, when the upper surface of the catalyst layer 30 is observed using a scanning electron microscope (SEM) at a magnification of ×10,000 to ×100,000, a proportion of the total area of the noble metal particles 31 in the area of the viewing field is, e.g., 50% to 90%, and typically, 75% to 85%.

Note that "the particle size" mentioned herein is a value obtained by the following method. First, the principal surface of the catalyst layer 30 is photographed using an SEM. The magnification is ×10,000 to ×100,000. Then, wholly seen particles 31 are selected from the image, and the area of each of the selected particles 31 is obtained. Subsequently, assuming that each particle 31 is a sphere, the diameter of the particle 31 is obtained from the area. This diameter is the particle size of the particle 31.

The catalyst layer 30 can be formed by, e.g., electroplating, reduction plating, or displacement plating. The catalyst layer 30 can also be formed by application of a dispersion containing noble metal particles, or vapor phase deposition such as evaporation or sputtering. Of these methods, displacement plating is particularly favorable because it is possible to directly and evenly deposit a noble metal on the region 11.

The deposition of a noble metal by displacement plating can be performed by using, e.g., a silver nitrate solution. An example of the process will be explained below.

A displacement plating solution is, e.g., a solution mixture of a silver nitrate solution, hydrofluoric acid, and water. Hydrofluoric acid has a function of removing a native oxide film from the surface of the structure 10.

When the structure 10 is dipped in the displacement plating solution, a native oxide film on the surface of the structure 10 is removed, and a noble metal, silver in this case, is deposited on a portion of the surface of the structure 10, which is not covered with the insulating layer 20. As a consequence, the catalyst layer 30 is obtained.

The silver nitrate concentration in the displacement plating solution is preferably 0.001 to 0.01 mol/L. Also, the hydrofluoric acid concentration in the displacement plating solution is preferably 0.1 to 6.5 mol/L.

Figure 3:
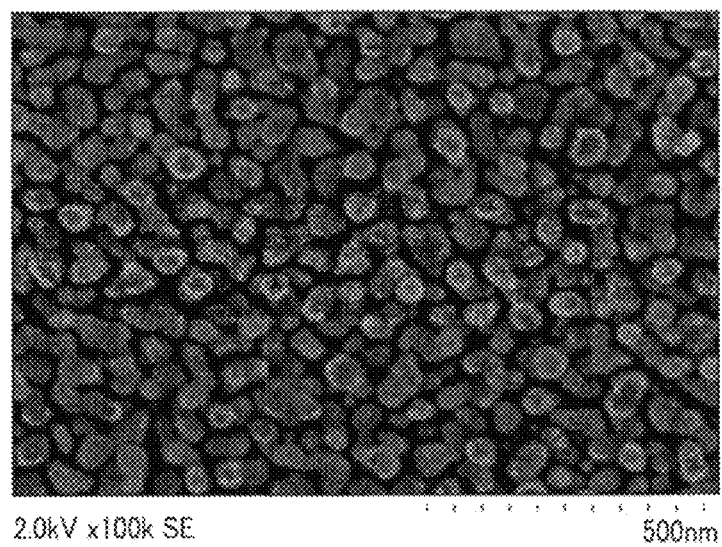
FIG. 3 is an electron micrograph of the upper surface of the catalyst layer.

The electron micrograph of FIG. 3 is an SEM image showing the upper surface of the catalyst layer 30. In this example, the catalyst layer 30 was formed by using an aqueous solution containing 0.005 mol/L of silver nitrate and 1.0 mol/L of hydrogen fluoride as the displacement plating solution, and dipping a 10 mm×10 mm silicon chip in this displacement plating solution at 25° C. for 3 min. Note that in this photograph shown in FIG. 3, white portions are silver particles. The particle sizes of these particles are about 100 nm.

Figure 4:
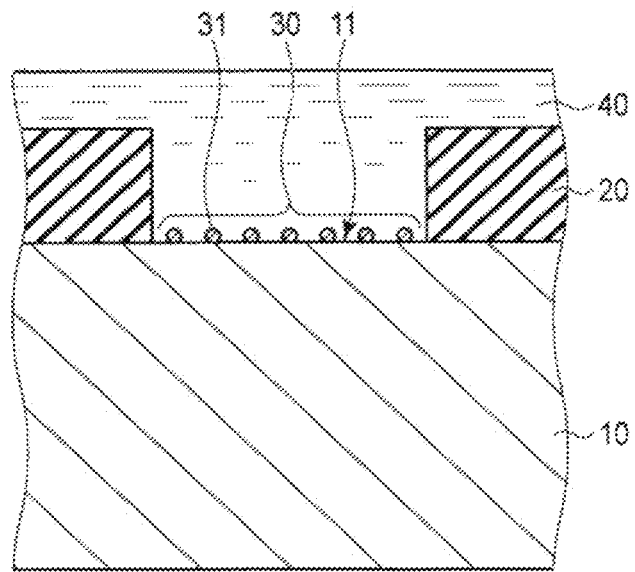
FIG. 4 is a sectional view schematically showing a dipping step in the etching method according to the embodiment.
Figure 7:
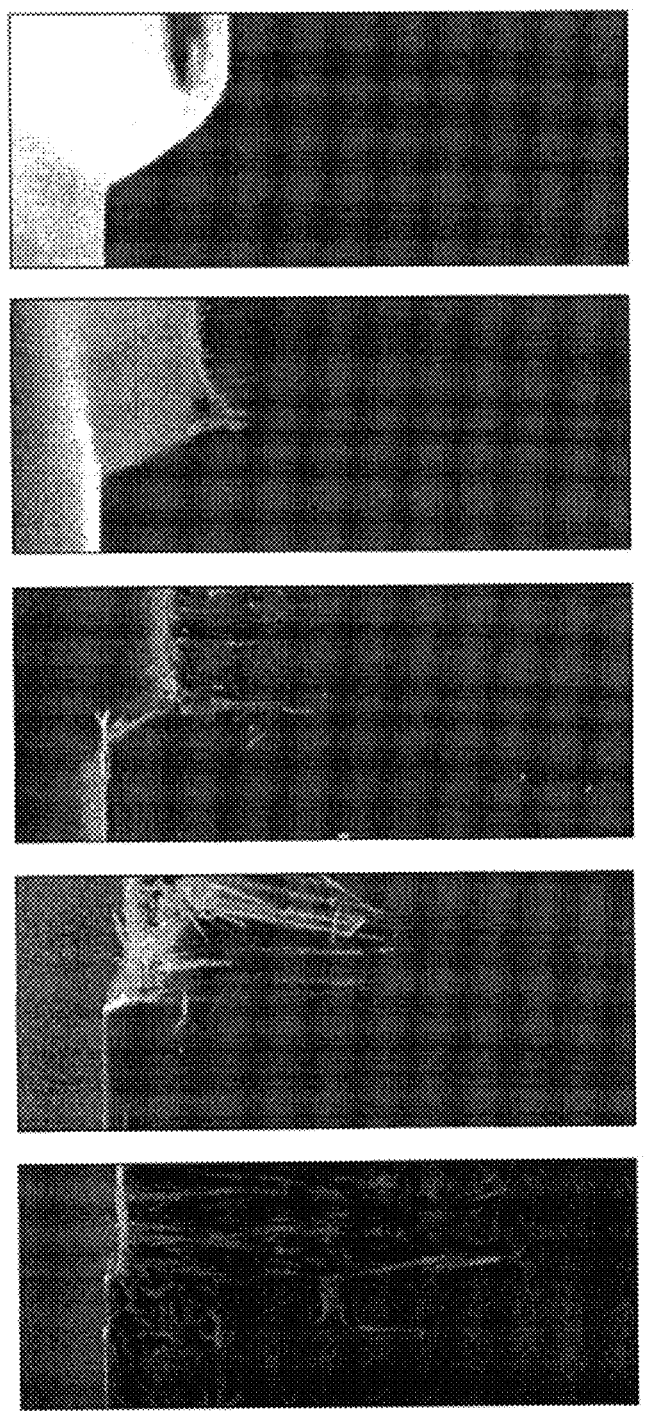
FIGS. 7A, 7B, 7C, 7D, and 7E are electron micrographs showing sections of structures obtained by etching methods using no organic additives.

Then, as shown in FIG. 4, the structure 10 on which the insulating layer 20 and catalyst layer 30 are formed is dipped in an etching solution 40. The etching solution 40 contains hydrofluoric acid, an oxidizer, and an organic additive.

When using an etching solution containing only hydrofluoric acid and an oxidizer instead of the etching solution 40, i.e., when omitting the organic additive from the etching solution 40, the semiconductor is oxidized in only portions of the region 11 that are close to the noble metal particles 31, and a generated oxide is dissolved away by hydrofluoric acid. Therefore, only the portions close to the noble metal particles 31 are selectively etched. The noble metal particles 31 do not chemically change and move downward as the etching progresses, and the same etching as described above is performed there. Consequently, as shown in FIG. 5, in those portions of the region 11 that correspond to the noble metal particles 31, etching progresses in a direction perpendicular to the upper surface of the structure 10. However, in those portions of the region 11 that correspond to gaps between the noble metal particles 31, etching does not progress, and the semiconductor remains in the shape of needles. That is, needle-like residual portions 12 are generated.

The micrograph of FIG. 6 is an SEM image showing a section of a structure obtained when using an etching solution containing only hydrofluoric acid and an oxidizer. In this example, a catalyst layer 30 was formed on a silicon ship, which was the structure 10, under the same conditions as those for the catalyst layer 30 shown in FIG. 3, an aqueous solution containing 10 mol/L of hydrogen fluoride and 2 mol/L of hydrogen peroxide was used as an etching solution, and the structure 10 was dipped in the etching solution for 30 min. Note that in FIG. 6, reference symbol R denotes a region (catalyst layer formation region) where the catalyst layer 30 was formed.

Even when using an etching solution containing only hydrofluoric acid and an oxidizer, if the oxidizer concentration in the etching solution is raised, the semiconductor oxidizes even in a portion of the region 11, which is not close to the noble metal particle 31. Accordingly, there is the possibility that the generation of the needle-like residual portions 12 is suppressed. However, if the oxidizer concentration is raised in the etching solution containing only hydrofluoric acid and an oxidizer, side etching progresses excessively, so no high aspect ratio can be achieved.

The micrographs of FIGS. 7A, 7B, 7C, 7D, and 7E are SEM images each showing a section of a structure obtained when using etching solutions containing only hydrofluoric acid and an oxidizer. In each of these examples, a catalyst layer 30 was formed on a silicon chip, which was the structure 10, under the same conditions as those for the structure 30 shown in FIG. 3. In an example shown in FIG. 7A, an aqueous solution containing 20 mol/L of hydrogen fluoride and 1 mol/L of hydrogen peroxide was used as the etching solution. In an example shown in FIG. 7B, an aqueous solution containing 10 mol/L of hydrogen fluoride and 2 mol/L of hydrogen peroxide was used as the etching solution. In an example shown in FIG. 7C, an aqueous solution containing 5 mol/L of hydrogen fluoride and 4 mol/L of hydrogen peroxide was used as the etching solution. In an example shown in FIG. 7D, an aqueous solution containing 4 mol/L of hydrogen fluoride and 5 mol/L of hydrogen peroxide was used as the etching solution. In an example shown in FIG. 7E, an aqueous solution containing 2.5 mol/L of hydrogen fluoride and 8 mol/L of hydrogen peroxide was used as the etching solution. The structure 10 was dipped in each etching solution for 30 min.

As shown in FIGS. 7A, 7B, 7C, 7D, and 7E, when using etching solutions containing only hydrofluoric acid and an oxidizer, the hardness of the generation of the needle-like residual portions 12 and the side etching amount had a tradeoff relationship.

To solve the aforementioned problem, the present inventor made extensive studies on the composition of an etching solution for use in the MacEtch method. As a consequence, the present inventor has found a composition which can achieve a high aspect ratio and hardly generates the needle-like residual portions 12.

As described above, the etching solution 40 herein used contains hydrofluoric acid, an oxidizer, and an organic additive. When the etching solution 40 is used, etching progresses in those portions of the region 11, which are close to the noble metal particles 31, and also progresses in other portions of the region 11. Consequently, as shown in FIG. 8, the generation of the needle-like residual portions 12 is suppressed, and a recess 14 having a high aspect ratio is obtained.

The concentration of hydrogen fluoride in the etching solution 40 is preferably 1 to 20 mol/L, more preferably, 5 to 10 mol/L, and most preferably, 3 to 7 mol/L. If the hydrogen fluoride concentration is low, a high etching rate is difficult to achieve. If the hydrogen fluoride concentration is high, excess side etching may occur.

The oxidizer can be selected from, e.g., $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is favorable as the oxidizer because hydrogen peroxide does not form any harmful byproduct and does not contaminate a semiconductor element.

The concentration of the oxidizer in the etching solution 40 is preferably 0.2 to 8 mol/L, more preferably, 2 to 4 mol/L, and most preferably, 3 to 4 mol/L.

The molecules of the organic additive are, e.g., polar molecules. An organic additive like this is generally water-soluble.

The molecular weight of the organic additive is preferably 60 to 20,000, and more preferably, 60 to 1,000. Note that when the organic additive is a polymer compound, its molecular weight is a weight-average molecular weight.

As the organic additive, it is possible to use one or more compounds selected from the group consisting of, e.g., alcohol, carboxylic acid, hydroxy acid, amine, amino acid, thiols, an organic fluorine compound, and a chelating agent.

As alcohol, it is possible to use ethylene glycol, diethylene glycol, polyethylene glycol, 1,4-butanediol, 1,6-hexanediol, or a combination thereof.

As carboxylic acid, it is possible to use monocarboxylic acid, polycarboxylic acid, or a combination thereof. As polycarboxylic acid, it is possible to use dicarboxylic acid such as malonic acid or succinic acid. As carboxylic acid, it is possible to use one type of compound or a plurality of types of compounds.

As hydroxy acid, it is possible to use, e.g., malic acid, citric acid, or a combination thereof.

As amine, it is possible to use, e.g., propylamine, dipropylamine, or a combination thereof.

As amino acid, it is possible to use, e.g., glycine, alanine, or a combination thereof.

As the organic fluorine compound, heptafluorobutyric acid or the like can be used.

As the chelating agent, it is possible to use, e.g., diethylenetriamine pentaacetic acid, ethylenediamine tetraacetic acid, or a combination thereof.

As an example, one or more compounds selected from the group consisting of polyethylene glycol, succinic acid, malic acid, dipropylamine, and alanine are used as the organic additive.

The concentration of the organic additive in the etching solution 40 is preferably 0.001 to 5 mass %, more preferably, 0.01 to 1 mass %, and most preferably, 0.05 to 0.2 mass %.

As described previously, the use of the organic additive suppresses the generation of the needle-like residual portions 12, so a recess having a high aspect ratio is obtained. The present inventor considers the reason for this as follows, although the present inventor does not want to be bound by a theory. Assume that the structure 10 is a silicon wafer.

As shown in FIG. 9, in a portion P1 of the region 11, which is close to the noble metal particles 31, catalysis of the noble metal particles 31 promotes silicon oxidation by the oxidizer. At least some excess holes generated in the portion P1 move to a surface region P2 of the structure 10 and distal end portions P3 of the needle-like residual portions 12.

Figure 10:
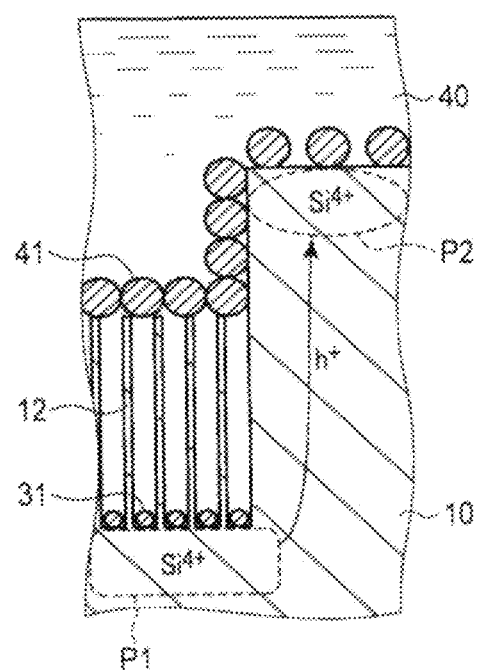
FIG. 10 is a schematic sectional view for explaining the reason why the needle-like residual portions hardly form.

In this example, since the gaps between the needle-like residual portions 12 are narrow and the shape of the residual portions 12 is needle-like, the deposition amount of an organic additive 41 to a unit amount of the semiconductor is larger in the distal end portions P3 of the needle-like residual portions 12 than in other portions of the structure 10. The organic additive attracts holes by the polarity. Also, the oxidizer and hydrofluoric acid are supplied to the distal end portions P3 of the needle-like residual portions 12 from not only the region above them but also the gaps between them. Consequently, as shown in FIG. 10, silicon oxidation by the oxidizer and removal of the generated oxide by dissolution by hydrofluoric acid are promoted in the distal end portions of the needle-like residual portions 12. Accordingly, the generation of the needle-like residual portions 12 is suppressed, and a recess having a high aspect ratio is obtained.

In another example, when the organic additive behaves as a complexing agent which forms a complex together with an element, silicon in this case, which forms the structure, the organic additive may accelerate dissolution of silicon in a portion of the structure 10 where holes exist. At least some excess holes generated by silicon oxidation move to the needle-like residual portions 12. In addition, the specific surface area of the needle-like residual portion 12 is larger than those of other portions of the structure 10. In the needle-like residual portion 12, therefore, etching of silicon by complexation occurs more easily than in other portions of the structure 10. Accordingly, the generation of the needle-like residual portions 12 is suppressed, and a recess having a high aspect ratio is obtained.

In still another example, the organic additive behaves as a surfactant, and promotes circulation of the etching solution from the gaps between the needle-like residual portions 12 to other regions and vice versa. The specific surface area of the distal end portion of the needle-like residual portion 12 is larger than those of other portions of the structure 10. As a result, in the needle-like residual portion 12, silicon oxidation by the oxidizer and removal of the generated oxide by dissolution by hydrofluoric acid are accelerated. Therefore, the generation of the needle-like residual portions 12 is suppressed, and a recess having a high aspect ratio is obtained.

Note that two or more reasons described above may be combined.

Figure 11:
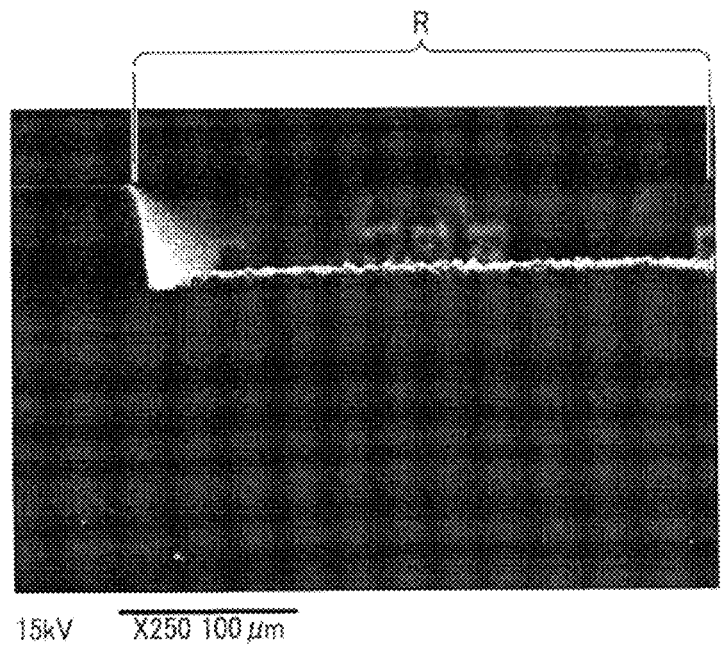
FIG. 11 is an electron micrograph of a section of a structure obtained by the etching method according to the embodiment.

The micrograph of FIG. 11 is an SEM image showing a section of a structure obtained when using an etching solution containing hydrofluoric acid, an oxidizer, and an organic additive. In this example, a catalyst layer 30 was formed on a silicon chip as the structure 10 under the same conditions as those for the catalyst layer 30 shown in FIG. 3. As the etching solution, an aqueous solution containing 5 mol/L of hydrogen fluoride, 4 mol/L of hydrogen peroxide, and 0.01 mass % of polyethylene glycol (average molecular weight=400) was used. The structure 10 was dipped in this etching solution for 30 min.

As shown in FIG. 11, it was possible to suppress the generation of the needle-like residual portions 12. Also, the sidewalls of a recess formed by etching were almost perpendicular to the upper surface of the structure 10.

Figure 12:
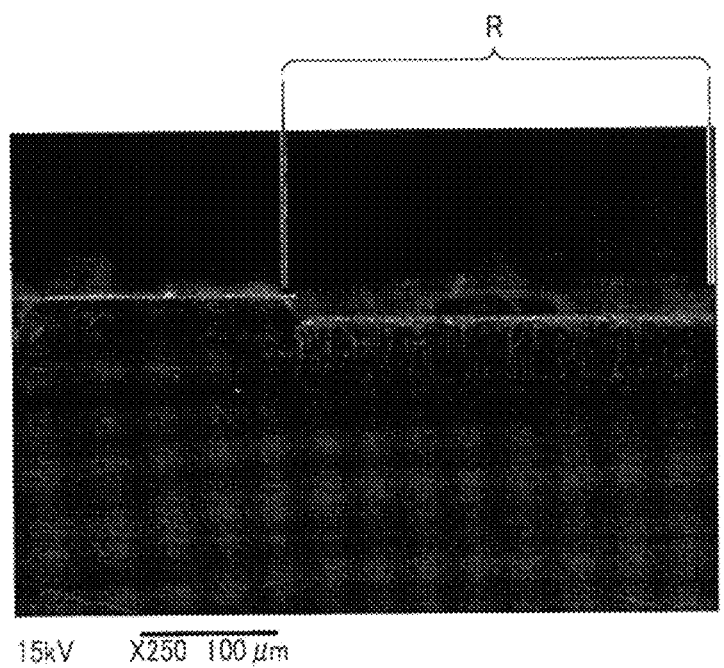
FIG. 12 is an electron micrograph of a section of a structure obtained by an etching method using no organic additive.
Figure 15:
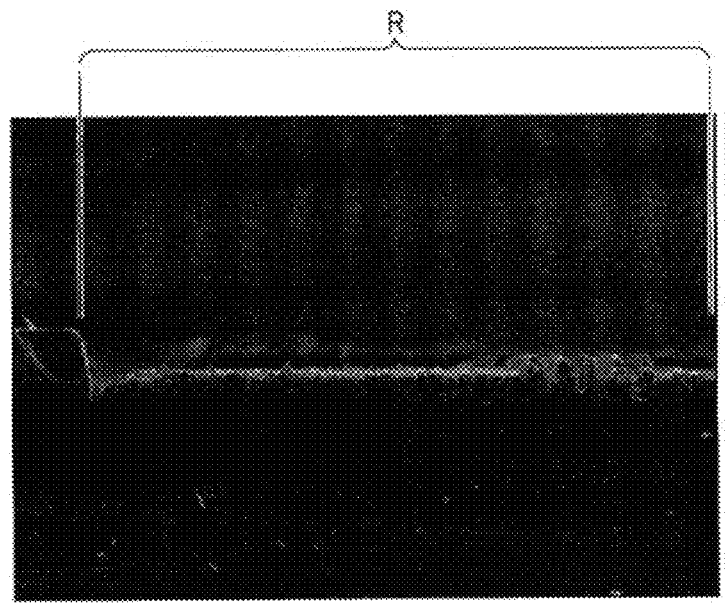
FIG. 15 is an electron micrograph of a section of a structure obtained when the concentration of polyethylene glycol (average molecular weight=200) in an etching solution was 1 mass %.

The micrograph of FIG. 12 is an SEM image showing a section of a structure obtained when using an etching solution containing only hydrofluoric acid and an oxidizer. The micrographs of FIGS. 13, 14, 15, 16, 17, 18, 19, 20, and 21 are SEM images each showing a section of a structure obtained when using an etching solution containing hydrofluoric acid, an oxidizer, and an organic additive.

In each of these examples, a catalyst layer 30 was formed on a silicon chip as the structure 10 under the same conditions as those for the catalyst layer 30 shown in FIG. 3. Then, the structure 10 was dipped in the etching solution for 30 min.

In the example shown in FIG. 12, an aqueous solution containing 5 mol/L of hydrogen fluoride and 4 mol/L of hydrogen peroxide was used as the etching solution.

In the example shown in FIG. 13, an aqueous solution containing 5 mol/L of hydrogen fluoride, 4 mol/L of hydrogen peroxide, and 0.01 mass % of polyethylene glycol (average molecular weight=200) was used as the etching solution. In the example shown in FIG. 14, an aqueous solution containing 5 mol/L of hydrogen fluoride, 4 mol/L of hydrogen peroxide, and 0.1 mass % of polyethylene glycol (average molecular weight=200) was used as the etching solution. In the example shown in FIG. 15, an aqueous solution containing 5 mol/L of hydrogen fluoride, 4 mol/L of hydrogen peroxide, and 1 mass % of polyethylene glycol (average molecular weight=200) was used as the etching solution.

Figure 16:
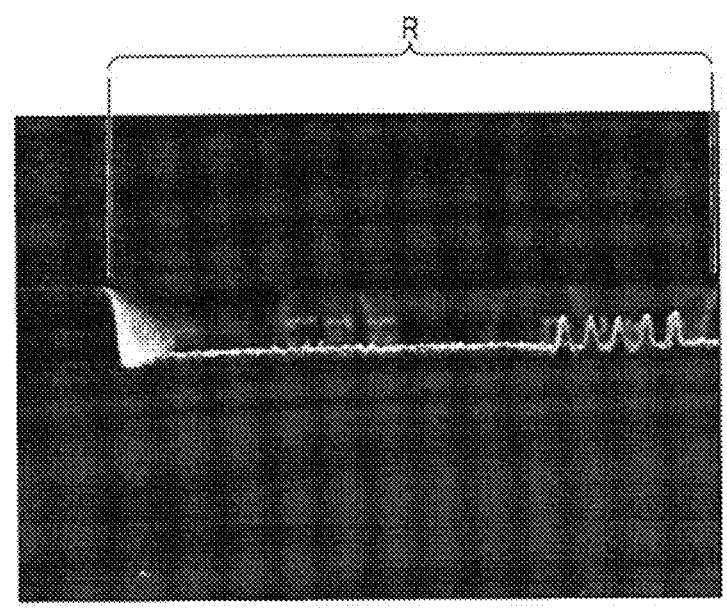
FIG. 16 is an electron micrograph of a section of a structure obtained when the concentration of polyethylene glycol (average molecular weight=400) in an etching solution was 0.01 mass %.
Figure 21:
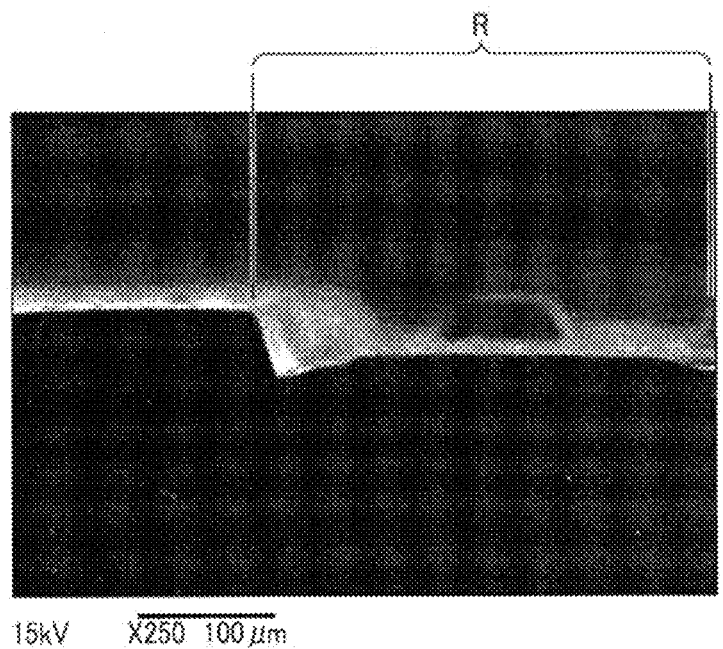
FIG. 21 is an electron micrograph of a section of a structure obtained when the concentration of polyethylene glycol (average molecular weight=1,000) in an etching solution was 1 mass %.

In the example shown in FIG. 16, an aqueous solution containing 5 mol/L of hydrogen fluoride, 4 mol/L of hydrogen peroxide, and 0.01 mass % of polyethylene glycol (average molecular weight=400) was used as the etching solution. In the example shown in FIG. 17, an aqueous solution containing 5 mol/L of hydrogen fluoride, 4 mol/L of hydrogen peroxide, and 0.1 mass % of polyethylene glycol (average molecular weight=400) was used as the etching solution. In the example shown in FIG. 18, an aqueous solution containing 5 mol/L of hydrogen fluoride, 4 mol/L of hydrogen peroxide, and 1 mass % of polyethylene glycol (average molecular weight=400) was used as the etching solution.

In the example shown in FIG. 19, an aqueous solution containing 5 mol/L of hydrogen fluoride, 4 mol/L of hydrogen peroxide, and 0.01 mass % of polyethylene glycol (average molecular weight=1,000) was used as the etching solution. In the example shown in FIG. 20, an aqueous solution containing 5 mol/L of hydrogen fluoride, 4 mol/L of hydrogen peroxide, and 0.1 mass % of polyethylene glycol (average molecular weight=1,000) was used as the etching solution. In the example shown in FIG. 21, an aqueous solution containing 5 mol/L of hydrogen fluoride, 4 mol/L of hydrogen peroxide, and 1 mass % of polyethylene glycol (average molecular weight=1,000) was used as the etching solution.

As is apparent from the comparison of FIG. 12 with FIGS. 13, 14, 15, 16, 17, 18, 19, 20, and 21, it was possible to suppress the generation of the needle-like residual portions 12 when the average molecular weight of polyethylene glycol was 200 to 1,000. It was also possible to suppress the generation of the needle-like residual portions 12 when the concentration of polyethylene glycol was 0.01 to 1 mass %. The effect of suppressing the generation of the needle-like residual portions 12 was particularly large when the average molecular weight of polyethylene glycol was 200 to 1,000 and the concentration of polyethylene glycol was 0.01 to 0.1 mass %.

Figure 22:
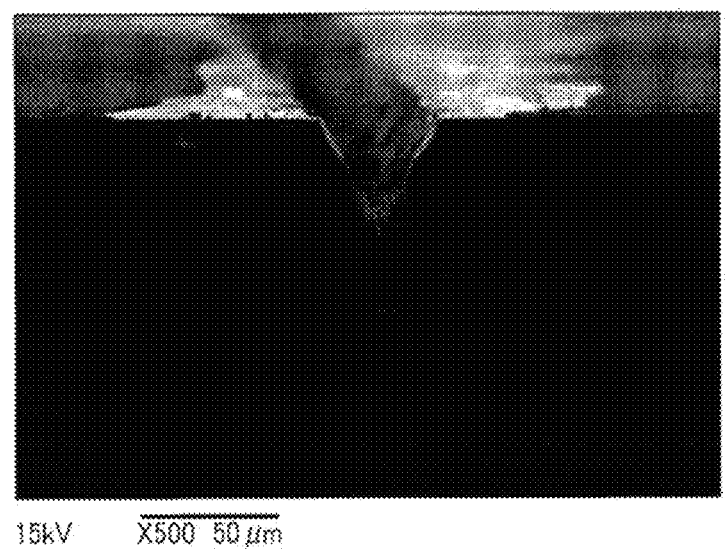
FIG. 22 is an electron micrograph of a section of a structure obtained by an etching method using no organic additive.

The micrograph of FIG. 22 is an SEM image showing a section of a structure obtained when using an etching solution containing only hydrofluoric acid and an oxidizer. The micrographs of FIGS. 23, 24, 25, 26, 27, 28, 29, 30, 31, and 32 are SEM images each showing a section of a structure obtained when using an etching solution containing hydrofluoric acid, an oxidizer, and an organic additive.

In each of these examples, a catalyst layer 30 was formed on a silicon chip as the structure 10 under the same conditions as those for the catalyst layer 30 shown in FIG. 3. Then, the structure 10 was dipped in the etching solution for 30 min.

In the example shown in FIG. 22, an aqueous solution containing 5 mol/L of hydrogen fluoride and 4 mol/L of hydrogen peroxide was used as the etching solution.

Figure 23:
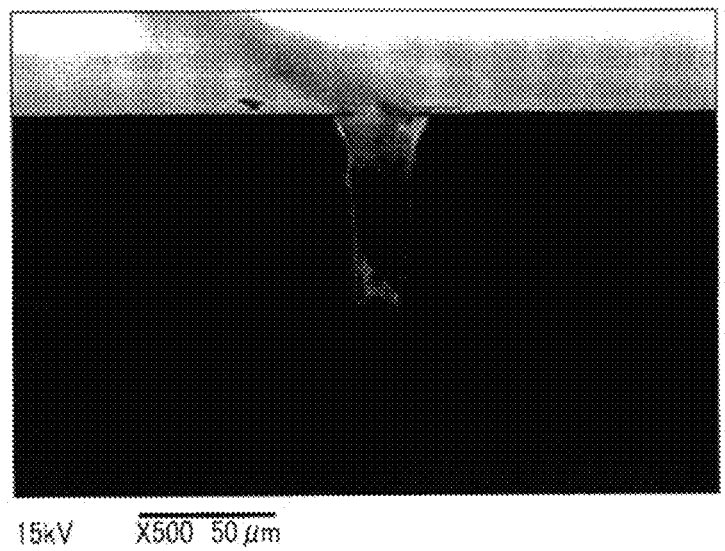
FIG. 23 is an electron micrograph of a section of a structure obtained when using polyethylene glycol (average molecular weight=200) as an organic additive.
Figure 24:
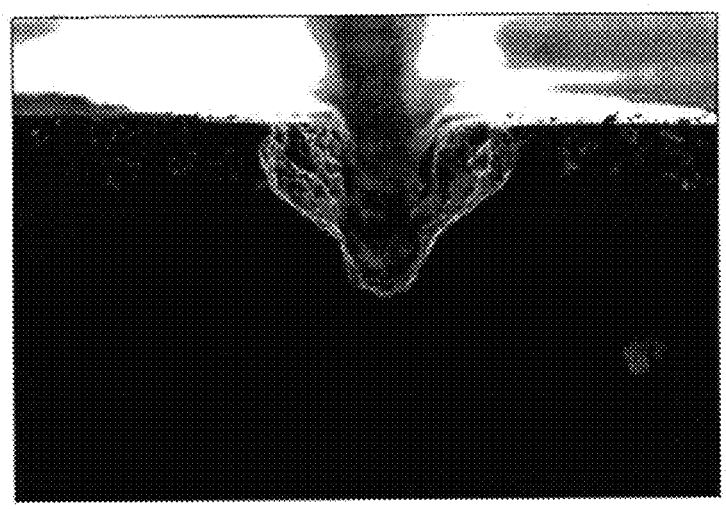
FIG. 24 is an electron micrograph of a section of a structure obtained when using polyethylene glycol (average molecular weight=400) as an organic additive.

In the example shown in FIG. 23, an aqueous solution containing 5 mol/L of hydrogen fluoride, 4 mol/L of hydrogen peroxide, and 0.1 mass % of polyethylene glycol (average molecular weight=200) was used as the etching solution. In the example shown in FIG. 24, an aqueous solution containing 5 mol/L of hydrogen fluoride, 4 mol/L of hydrogen peroxide, and 0.1 mass % of polyethylene glycol (average molecular weight=400) was used as the etching solution. In the example shown in FIG. 25, an aqueous solution containing 5 mol/L of hydrogen fluoride, 4 mol/L of hydrogen peroxide, and 0.1 mass % of polyethylene glycol (average molecular weight=1,000) was used as the etching solution. In the example shown in FIG. 26, an aqueous solution containing 5 mol/L of hydrogen fluoride, 4 mol/L of hydrogen peroxide, and 0.1 mass % of polyethylene glycol (average molecular weight=4,000) was used as the etching solution. In the example shown in FIG. 27, an aqueous solution containing 5 mol/L of hydrogen fluoride, 4 mol/L of hydrogen peroxide, and 0.1 mass % of polyethylene glycol (average molecular weight=6,000) was used as the etching solution. In the example shown in FIG. 28, an aqueous solution containing 5 mol/L of hydrogen fluoride, 4 mol/L of hydrogen peroxide, and 0.1 mass % of polyethylene glycol (average molecular weight=20,000) was used as the etching solution.

Figure 29:
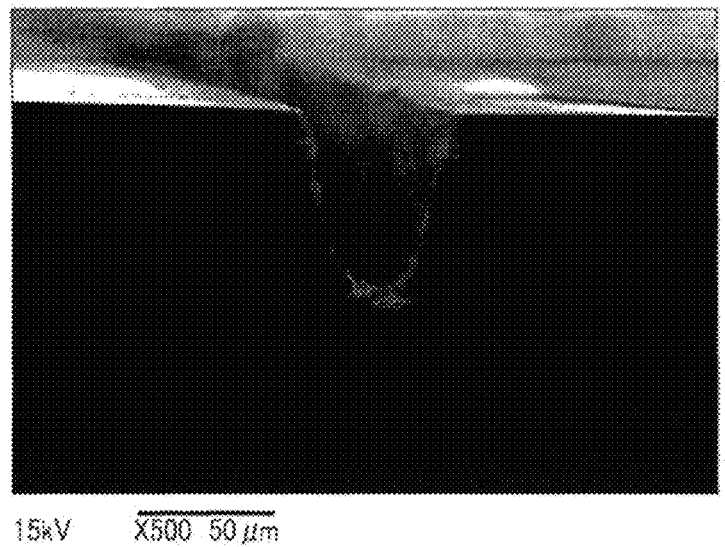
FIG. 29 is an electron micrograph of a section of a structure obtained when using succinic acid as an organic additive.
Figure 30:
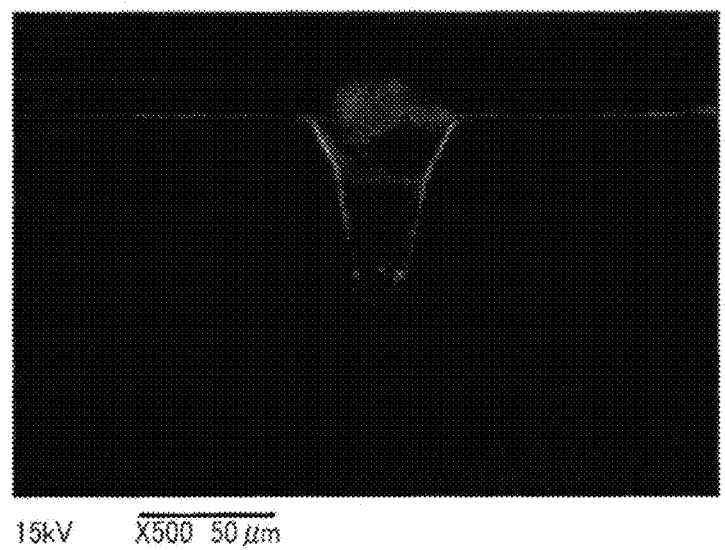
FIG. 30 is an electron micrograph of a section of a structure obtained when using malic acid as an organic additive.
Figure 31:
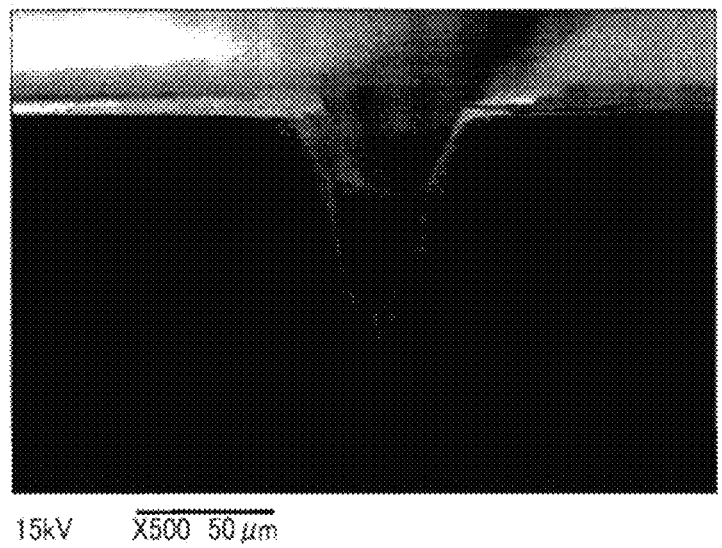
FIG. 31 is an electron micrograph of a section of a structure obtained when using dipropyl amine as an organic additive.
Figure 32:
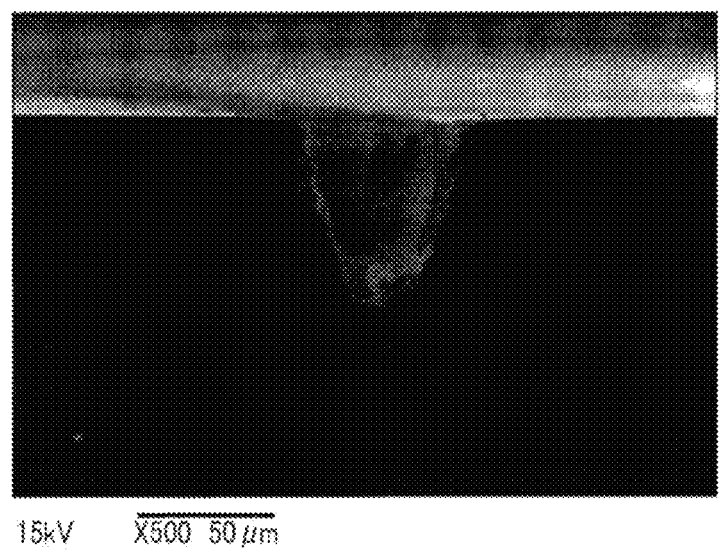
FIG. 32 is an electron micrograph of a section of a structure obtained when using alanine as an organic additive.

In the example shown in FIG. 29, an aqueous solution containing 5 mol/L of hydrogen fluoride, 4 mol/L of hydrogen peroxide, and 0.1 mass % of succinic acid was used as the etching solution. In the example shown in FIG. 30, an aqueous solution containing 5 mol/L of hydrogen fluoride, 4 mol/L of hydrogen peroxide, and 0.1 mass % of malic acid was used as the etching solution. In the example shown in FIG. 31, an aqueous solution containing 5 mol/L of hydrogen fluoride, 4 mol/L of hydrogen peroxide, and 0.1 mass % of dipropylamine was used as the etching solution. In the example shown in FIG. 32, an aqueous solution containing 5 mol/L of hydrogen fluoride, 4 mol/L of hydrogen peroxide, and 0.1 mass % of alanine was used as the etching solution.

As is apparent from the comparison of FIG. 23 with FIGS. 24, 25, 26, 27, 28, 29, 30, 31, and 32, it was possible to suppress the generation of the needle-like residual portions 12 and achieve high aspect ratios not only when using polyethylene glycol as the organic additive but also when using other compounds as the organic additive.

As explained above, the method according to the embodiment can perform high-aspect-ratio deep etching by a simple wet process. That is, the embodiment provides an etching technique capable of anisotropic etching.

In the above explanation, the aggregate of the plurality of particles 31 each made of a noble metal was used as the catalyst layer 30, but the catalyst layer 30 may also have another form. For example, the catalyst layer 30 may also be obtained by forming a plurality of through holes in a continuous layer.

The above-described etching method can be used to manufacture various articles. For example, the above-described etching method can be used to manufacture a semiconductor device, a circuit board such as an interposer, or a stamper for use in nanoimprinting. It is also possible to use this etching method to manufacture a substrate, such as a protective substrate, which has a recess in one principal surface and forms a hollow structure when bonded to another substrate.

This etching method is also usable to form a recess such as a trench or a through hole such as a via hole. The etching method can also be used to divide a structure such as a substrate.

FIGS. 33, 34, 35, 36, 37, and 38 illustrate a method of dividing a semiconductor wafer into a plurality of semiconductor chips.

In this method, a structure shown in FIGS. 33 and 34 is first prepared. This structure includes a semiconductor wafer 10, insulating layer 20, and dicing sheet 50. Semiconductor elements 13 are formed in the surface region of the semiconductor wafer 10. The insulating layer 20 covers a region of the semiconductor wafer 10, in which the semiconductor elements 13 are formed, and protects the semiconductor elements 13 against damage. The dicing sheet 50 is adhered on a surface of the semiconductor wafer 10, which is opposite to the surface on which the protective layer 20 is formed.

Then, a catalyst layer 30 is formed on the semiconductor wafer 10 as shown in FIGS. 35 and 36. As an example, the catalyst layer 30 is an aggregate of a plurality of particles 31 each made of a noble metal.

Figure 37:
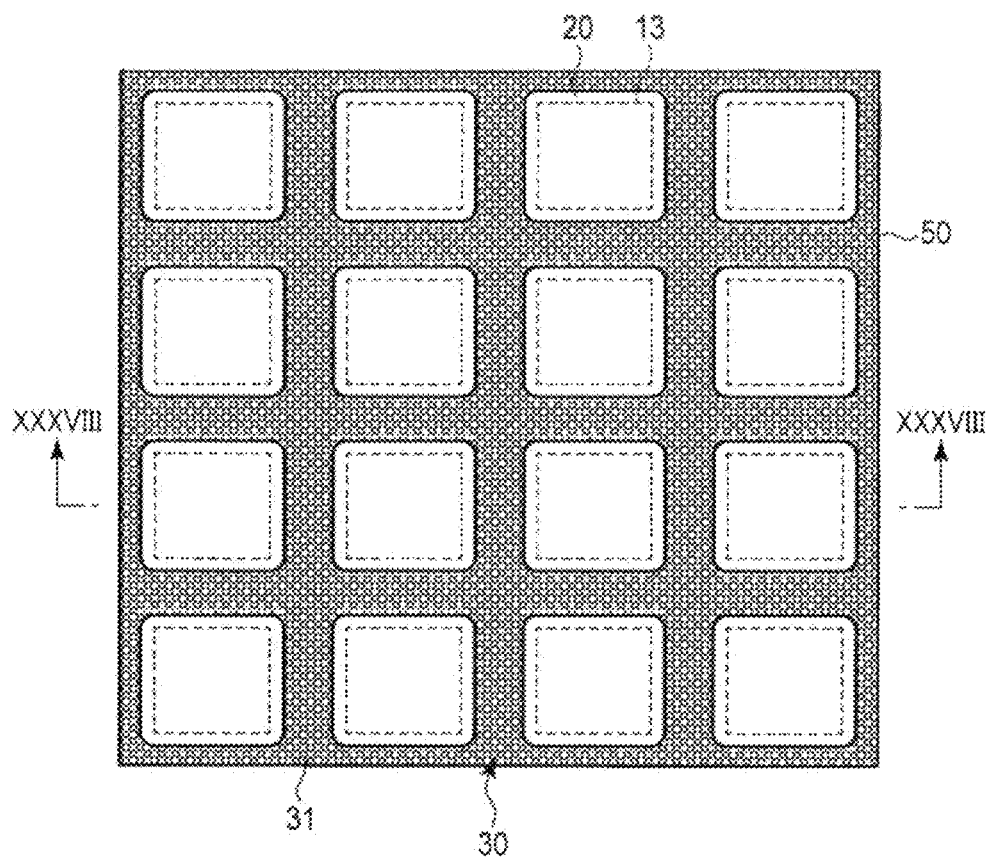
FIG. 37 is a plan view schematically showing an example of the structure obtained by the method shown in FIGS. 33, 34, 35, and 36.
Figure 38:
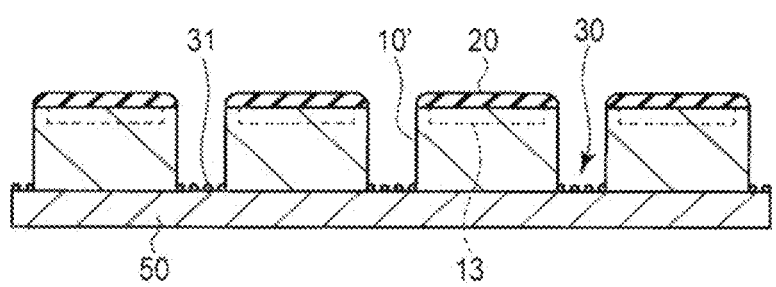
FIG. 38 is a sectional view taken along a line XXXVIII-XXXVIII of the structure shown in FIG. 37.

After that, etching is performed by using an etching solution containing hydrofluoric acid, an oxidizer, and an organic additive. More specifically, the structure shown in FIGS. 35 and 36 is dipped in the etching solution so as to remove a portion of the semiconductor wafer 10 that is positioned below the catalyst layer 30. Thus, a semiconductor chip 10' each including the semiconductor element 13 is obtained as shown in FIGS. 37 and 38.

In this method, the insulating layer 20 can be used as, e.g., a protective layer for protecting the semiconductor chip 10'. The insulating layer 20 covers the entire surface of the semiconductor chip 10'. Therefore, this method can achieve a high strength as compared with the case where general dicing using a blade is performed.

Also, in this method, the shape of the upper surface of the semiconductor chip 10' is not limited to a square or rectangle. For example, the upper surface shape of the semiconductor chip 10' may also be a circle or triangle. Furthermore, this method can simultaneously form semiconductor chips 10' having different upper surface shapes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An etching method, comprising:
    forming a catalyst layer made of a noble metal on a structure made of a semiconductor; and
    dipping the structure in an etching solution containing hydrofluoric acid, an oxidizer, and an organic additive to remove a portion of the structure that is in contact with the catalyst layer,
    the organic additive is at least one selected from the group consisting of a polyethylene glycol, succinic acid, malic acid, dipropylamine and alanine.

2. The method according to claim 1, wherein the organic additive has a molecular weight of 60 to 20,000.

3. The method according to claim 1, wherein a concentration of the organic additive in the etching solution is 0.01 to 1 mass %.

4. The method according to claim 1, wherein a concentration of hydrogen fluoride in the etching solution is 5 to 10 mol/L.

5. The method according to claim 1, wherein a concentration of the oxidizer in the etching solution is 2 to 4 mol/L.

6. The method according to claim 1, wherein an aggregate of particles each made of the noble metal is formed as the catalyst layer, and the structure is dipped in the etching solution to remove portions of the structure that are close to the particles and a portion of the structure that corresponds to a gaps between the particles.

7. A method of manufacturing an article, the method comprising etching the structure by the etching method according to claim 1.

8. The method according to claim 7, wherein the article is a semiconductor device.

* * * * *